(12) United States Patent  
Kawahara

(10) Patent No.: US 7,696,045 B2
(45) Date of Patent: Apr. 13, 2010

(54) METHOD OF MANUFACTURING SEMICONDUCTOR DEVICE

(75) Inventor: Minoru Kawahara, Shiga (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/840,964

(22) Filed: Aug. 18, 2007

(65) Prior Publication Data

US 2008/0050920 A1 Feb. 28, 2008

(30) Foreign Application Priority Data

Aug. 22, 2006 (JP) ............................. 2006-225282

(51) Int. Cl.
*H01L 21/336* (2006.01)
(52) U.S. Cl. ............................. 438/270; 257/E21.419; 257/E21.428; 257/E21.384
(58) Field of Classification Search ................ 438/270, 438/770, 589, 719, 243, 248, 227, 226; 257/E21.564, 257/E21.384, E21.419, E21.428, E29.321
See application file for complete search history.

(56) References Cited

U.S. PATENT DOCUMENTS

| | | | | | |
|---|---|---|---|---|---|
| 4,984,039 | A | * | 1/1991 | Douglas | ............... 257/301 |
| 6,077,744 | A | * | 6/2000 | Hao et al. | ............... 438/268 |
| 6,251,734 | B1 | * | 6/2001 | Grivna et al. | ............... 438/296 |
| 6,444,528 | B1 | * | 9/2002 | Murphy | ............... 438/270 |
| 6,479,394 | B1 | * | 11/2002 | Choutov et al. | ............... 438/714 |
| 6,590,240 | B1 | * | 7/2003 | Lanois | ............... 257/256 |
| 2005/0167744 | A1 | * | 8/2005 | Yilmaz | ............... 257/329 |

FOREIGN PATENT DOCUMENTS

JP 2001-326273 A 11/2001

OTHER PUBLICATIONS

Waters et al. "Polysilicon Overfill Etch Back Using Wet Chemical Spin-process Technology" IEEE/SEMI Advanced Semiconductor manufacturing Conference, 1999, pp. 233-238.*

* cited by examiner

*Primary Examiner*—W. David Coleman
*Assistant Examiner*—Shaka Scarlett
(74) *Attorney, Agent, or Firm*—Sughrue Mion, PLLC

(57) ABSTRACT

A method of manufacturing a semiconductor device according to an embodiment of the present invention includes: forming a first insulating film on a semiconductor substrate; forming a mask with an opening of a predetermined pattern in the first insulating film; performing anisotropic etching on the semiconductor substrate with the mask used as an etching mask to form a trench; forming a second insulating film on a surface of an inner wall of the trench with the mask used as a selective oxidation mask; removing the mask; forming a conductive film on the semiconductor substrate to fill the trench with the conductive film; and etching back the conductive film until at least a surface of the semiconductor substrate is exposed.

18 Claims, 6 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device. In particular, the invention relates to a method of manufacturing a semiconductor device having a trench gate structure.

2. Description of Related Art

In recent years, attentions have been paid to a device with a gate electrode embedded in a trench, a so-called semiconductor device having a trench gate structure along with improvements in degree of integration of the semiconductor device.

Referring to FIGS. 3A to 3D and FIGS. 4E to 4G, an example of a method of manufacturing a semiconductor device having a trench gate structure is described.

FIGS. 3A to 3D and FIGS. 4E to 4G are longitudinal sectional views schematically illustrating a method of forming a trench gate structure in a manufacturing process of a semiconductor device of the related art.

First, as shown in FIG. 3A, a silicon oxide film 52a is formed on a semiconductor substrate 51 made of single crystal silicon.

Next, as shown in FIG. 3B, an opening 53 of a predetermined pattern is formed in the silicon oxide film 52a by photolithography and etching to thereby form a mask 52 made of silicon oxide.

Next, as shown in FIG. 3C, the mask 52 is used as etching mask upon anisotropic etching to form a trench 54 in the semiconductor substrate 51.

After that, as shown in FIG. 3D, the mask is removed.

Next, as shown in FIG. 4E, a gate insulating film 55 made of silicon oxide with a thickness of about 500 Å is formed on the semiconductor substrate 51 inclusive of a surface of an inner wall of the trench 54 by thermal oxidation.

Next, as shown in FIG. 4F, a conductive film 56 for forming a gate electrode, which is made of polycrystalline silicon is formed on semiconductor substrate 51 by CVD. As a result, the trench 54 is filled with the conductive film 56.

After that, as shown in FIG. 4G, the conductive film 56 for forming a gate electrode is etched back by dry etching to thereby form a gate electrode 57. One of a similar technique is disclosed in, for example, Japanese Unexamined Patent Application Publication No. 2001-326273.

However, the above manufacturing method of the related art requires over-etching to complete remove the conductive film 56 from the surface of the gate insulating film 55 at the time of etching back the conductive film 56 to form the gate electrode 57.

Then, upon the over-etching, the gate insulating film 55 functions as an etching stopper, so etching is stopped on the surface of the gate insulating film 55 and etching proceeds on the conductive film 56 in the trench 54.

Therefore, it is inevitable that an upper surface of the gate electrode 57 is positioned below the surface of the semiconductor substrate 51 by a predetermined depth, that is, a difference in level L is formed.

If this difference in level L is formed, there is a possibility that the upper surface of the gate electrode 57 is positioned below the bottom of a source region (not shown) formed in the semiconductor substrate 51 in a subsequent step, and the manufactured device cannot operate as an FET.

SUMMARY

The present invention aims at providing a method of manufacturing a semiconductor device, which can reduce making difference in level between a surface of a semiconductor substrate and an upper surface of a gate electrode upon etching back a conductive film for forming a gate electrode.

A method of manufacturing a semiconductor device according to an aspect of the present invention includes: forming a first insulating film on a semiconductor substrate; forming a mask with an opening of a predetermined pattern in the first insulating film; performing anisotropic etching on the semiconductor substrate with the mask used as an etching mask to form a trench; forming a second insulating film on a surface of an inner wall of the trench with the mask used as a selective oxidation mask; removing the mask; forming a conductive film on the semiconductor substrate to fill the trench with the conductive film; and etching back the conductive film until at least a surface of the semiconductor substrate is exposed.

According to the method of manufacturing a semiconductor device of the present invention, it is possible to reduce making difference in level between a surface of a semiconductor substrate and an upper surface of a gate electrode upon etching back a conductive film for forming a gate electrode.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

According to one embodiment of the present invention, a difference in level that is formed between a surface of a semiconductor substrate and an upper surface of a gate electrode upon etching back a conductive film for forming a gate electrode is reduced as follows. That is, a first insulating film is formed on a semiconductor substrate, an opening of a predetermined pattern is formed in the first insulating film to form a mask, the mask is used as an etching mask to perform anisotropic etching on the semiconductor substrate to form a trench, the mask is used as a selective oxidation mask to form a second insulating film on a surface of an inner wall of the trench, the mask is removed, an conductive film is formed on the semiconductor substrate to fill the trench with the conductive film, and then the conductive film is etched back until at least the surface of the semiconductor substrate is exposed.

Referring to FIGS. 1A to 1D and FIGS. 2E to 2G, an example of a method of manufacturing a semiconductor device having a trench gate structure according to the present invention is described.

FIGS. 1A to 1D and FIGS. 2E to 2G are longitudinal sectional views schematically illustrating a method of forming a trench gate structure in a manufacturing process of a semiconductor device of the present invention.

Figure 1A:
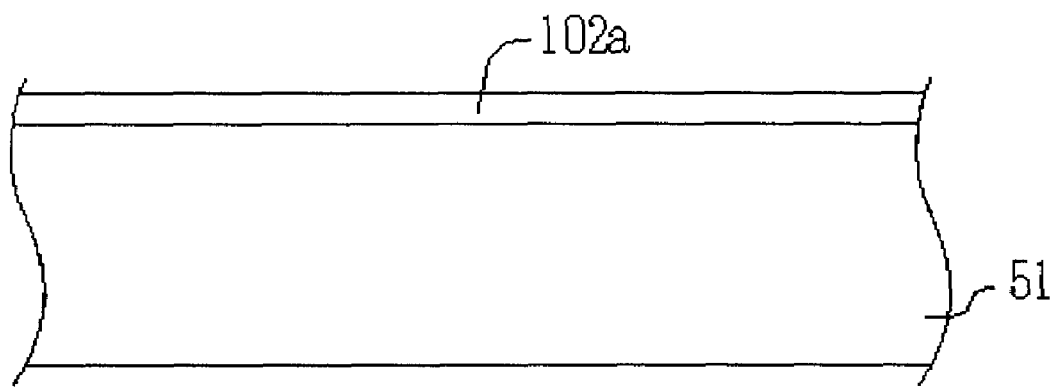
FIG. 1A is a longitudinal sectional view of an example of a method of manufacturing a semiconductor device according to an embodiment of the present invention.

First, as shown in FIG. 1A, a silicon nitride film 102a is formed on a semiconductor substrate 51 made of single crystal silicon by CVD.

Figure 1B:
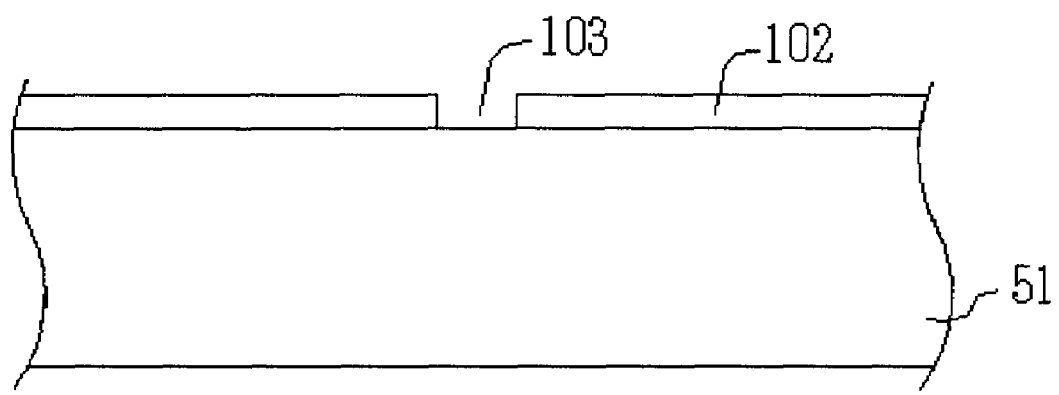
FIG. 1B is a longitudinal sectional view of an example of a method of manufacturing a semiconductor device according to an embodiment of the present invention.

Next, as shown in FIG. 1B, an opening 103 of a predetermined pattern is formed in the silicon nitride film 102a by photolithography and etching to thereby form a mask 102 made of silicon nitride.

Figure 1C:
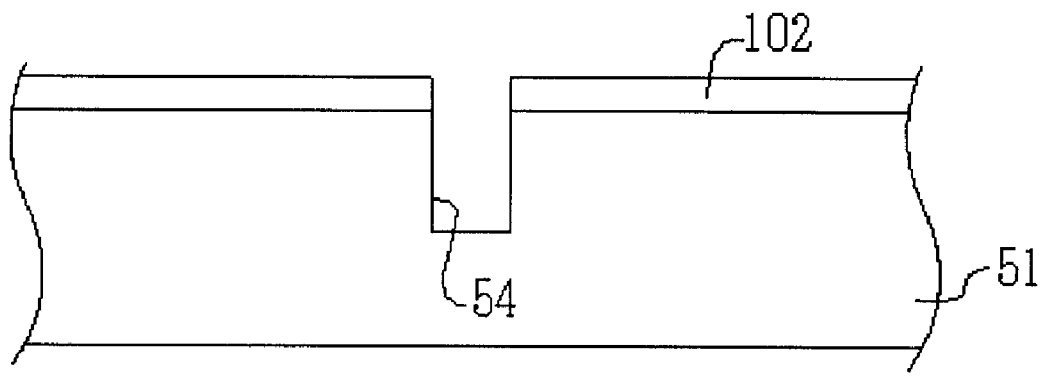
FIG. 1C is a longitudinal sectional view of an example of a method of manufacturing a semiconductor device according to an embodiment of the present invention.

Next, as shown in FIG. 1C, the mask 102 is used as an etching mask upon anisotropic etching to form a trench 54 in the semiconductor substrate 51.

Figure 1D:
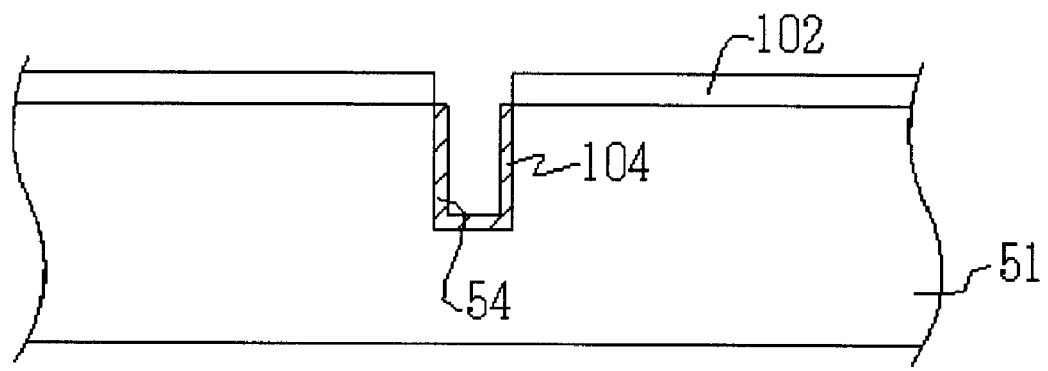
FIG. 1D is a longitudinal sectional view of an example of a method of manufacturing a semiconductor device according to an embodiment of the present invention.

Next, as shown in FIG. 1D, the mask 102 made of silicon nitride is used as a selective oxidation mask to form a gate insulating film 104 made of silicon oxide with a thickness of about 500 Å on the surface of an inner wall of the trench 54 by thermal oxidation.

Figure 2E:
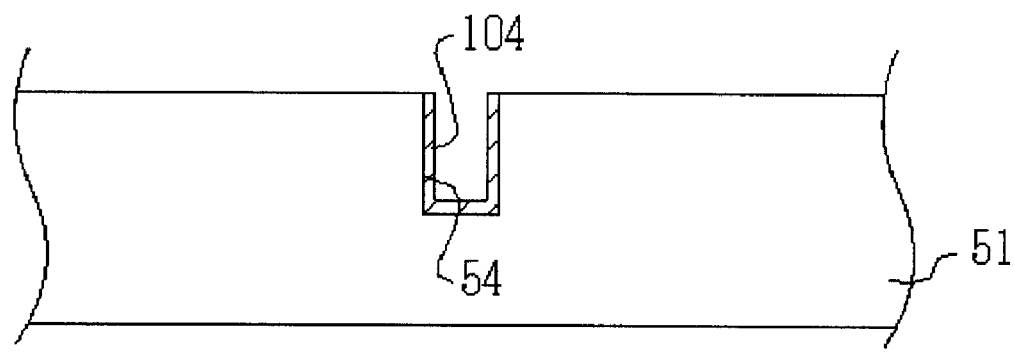
FIG. 2E is a longitudinal sectional view of an example of a method of manufacturing a semiconductor device according to an embodiment of the present invention.

After that, as shown in FIG. 2E, the mask 102 made of silicon nitride is removed with a hot phosphoric acid.

As a result, the surface of the inner wall of the trench 54 is covered with the gate insulating film 104, and the surface of the semiconductor substrate 51 is exposed.

Figure 2F:
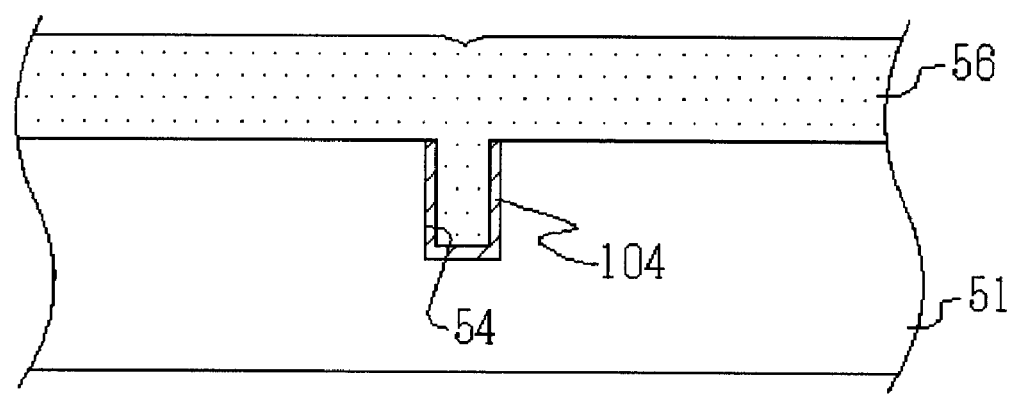
FIG. 2F is a longitudinal sectional view of an example of a method of manufacturing a semiconductor device according to an embodiment of the present invention.

Next, as shown in FIG. 2F, a conductive film 56 that serves as a gate electrode made of polycrystalline silicon is formed on the semiconductor substrate 51 by CVD. Thus, the trench 54 is filled with the conductive film 56.

Figure 2G:
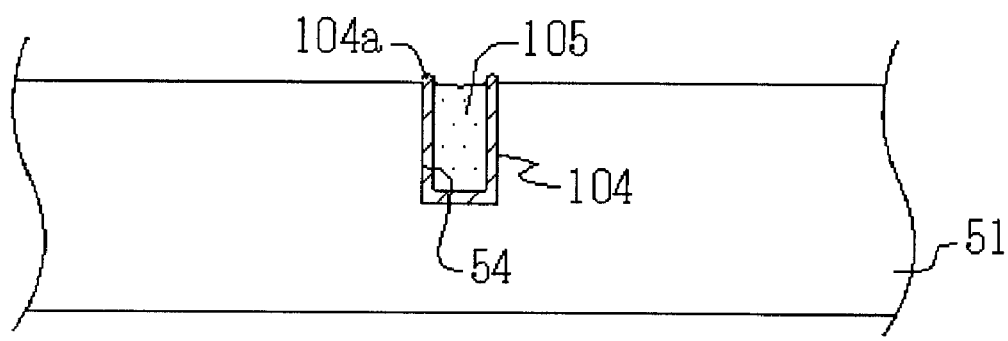
FIG. 2G is a longitudinal sectional view of an example of a method of manufacturing a semiconductor device according to an embodiment of the present invention.
Figure 3A:
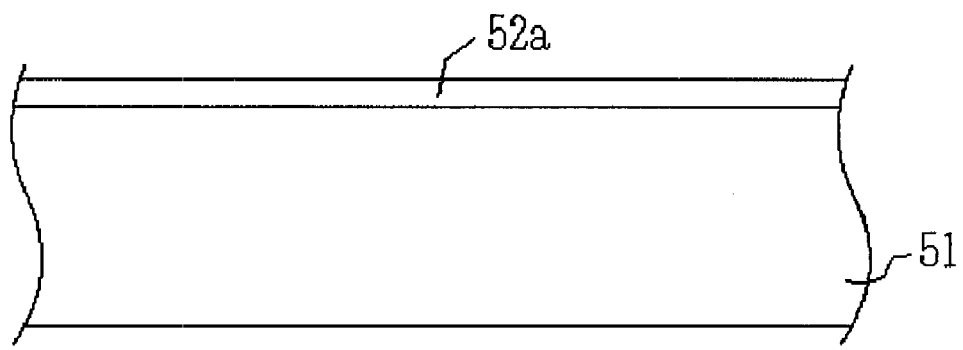
FIG. 3A is a longitudinal sectional view of an example of a method of manufacturing a semiconductor device of the related art.
Figure 3B:
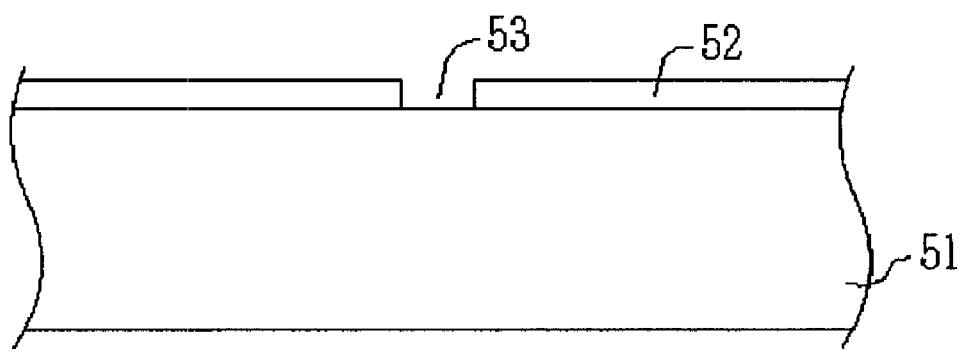
FIG. 3B is a longitudinal sectional view of an example of a method of manufacturing a semiconductor device of the related art.
Figure 3C:
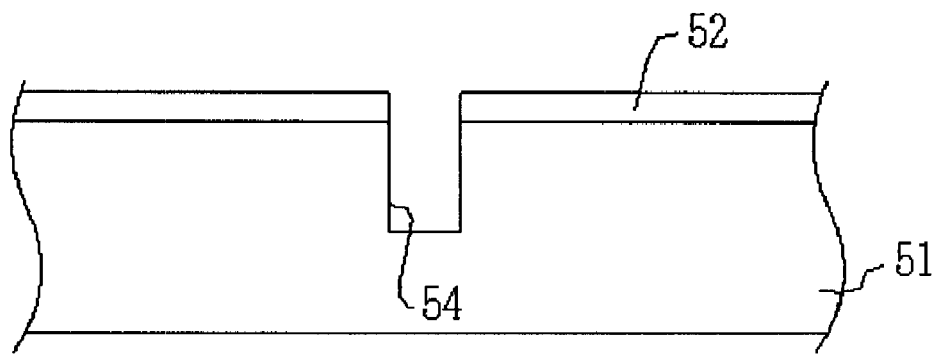
FIG. 3C is a longitudinal sectional view of an example of a method of manufacturing a semiconductor device of the related art.
Figure 3D:
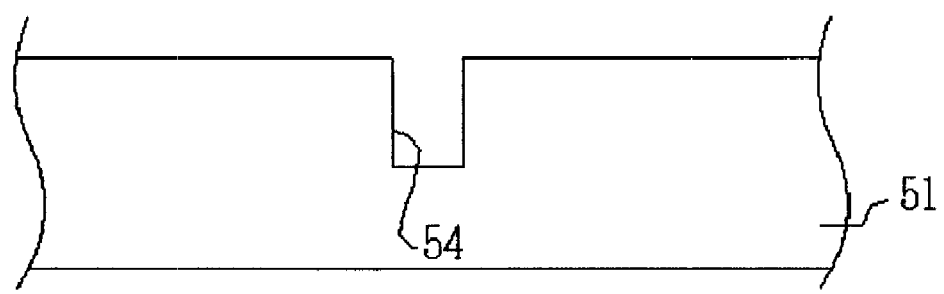
FIG. 3D is a longitudinal sectional view of an example of a method of manufacturing a semiconductor device of the related art.
Figure 4E:
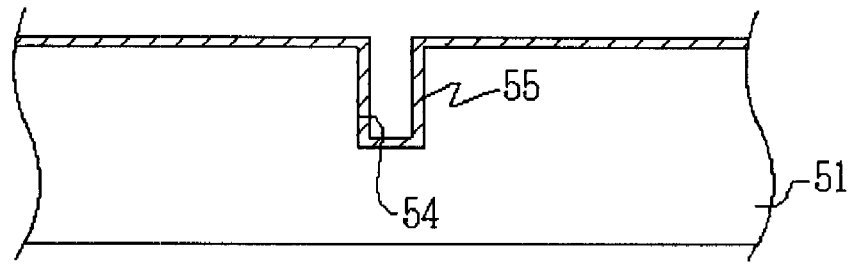
FIG. 4E is a longitudinal sectional view of an example of a method of manufacturing a semiconductor device of the related art.
Figure 4F:
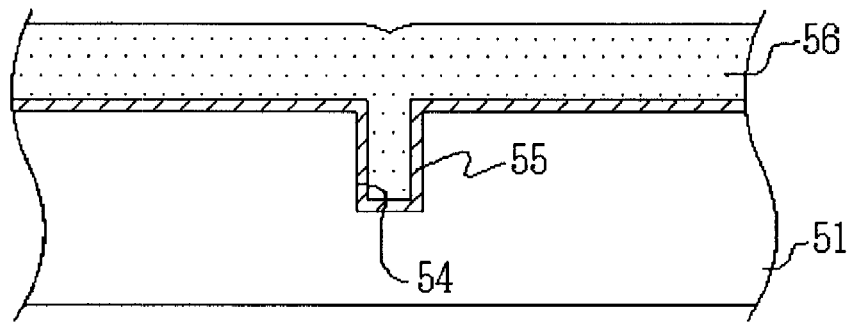
FIG. 4F is a longitudinal sectional view of an example of a method of manufacturing a semiconductor device of the related art.
Figure 4G:
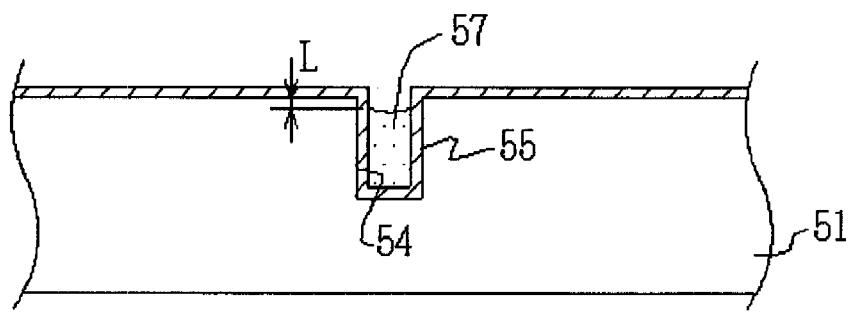
FIG. 4G is a longitudinal sectional view of an example of a method of manufacturing a semiconductor device of the related art.

After that, as shown in FIG. 2G, the conductive film that serves as a gate electrode is etched back by dry etching to form a gate electrode 105.

Incidentally, in order to completely remove the conductive film 56 from the surface of the semiconductor substrate 51 upon etching back the conductive film to form the gate electrode 105, the conductive film is over-etched until the semiconductor substrate 51 is etched by a predetermined depth even after the surface of the semiconductor substrate 51 is exposed.

As a result, a protrusion 104a of the gate insulating film 104 that is etched at a small etching rate protrudes from the surface of the semiconductor substrate 51. This protrusion may be removed by isotropic etching with a hydrofluoric acid or ammonium fluoride.

Incidentally, in the above description, the protrusion is removed by isotropic etching but may be removed by anisotropic etching.

As described above, if an etchant that does not remove the gate insulating film 104 (silicon oxide) is used in a step of removing the mask 102, after the gate insulating film 104 is formed on the surface of the inner wall of the trench 54, only the mask 102 can be removed. As a result, an insulating film (silicon nitride) that functions as an etching stopper upon etching back the conductive film 56 is not left on the surface of the semiconductor substrate 51.

Hence, even if over etching is performed, the semiconductor substrate 51 made of single crystal silicon and the conductive film 56 in the trench 54, which is made of polycrystalline silicon are etched to the same depth because of the same etching rate. Thus, there is a very small difference in level between the surface of the semiconductor substrate 51 and an upper of the gate electrode 105.

The present invention is applicable to a method of manufacturing a semiconductor device with a reduced difference in level between a surface of a semiconductor substrate and an upper surface of a gate electrode in a method of manufacturing a semiconductor device having a trench gate structure.

It is apparent that the present invention is not limited to the above embodiment but may be modified and changed without departing from the scope and spirit of the invention.

What is claimed is:

1. A method of manufacturing a semiconductor device, comprising:
   (a) forming a mask with an opening of a predetermined pattern which is made of a mask insulating film on a semiconductor substrates;
   (b) forming a trench in the substrate using the mask as an etching mask;
   (c) forming a gate insulating film on a surface of an inner wall of the trench with the mask used as a selective oxidation mask;
   (d) removing the mask;
   (e) forming a conductive film on the semiconductor substrate to fill the trench with the conductive film; and
   (f) etching back the conductive film until at least a surface of the semiconductor substrate is exposed.

2. The method of manufacturing a semiconductor device according to claim 1, wherein an etchant that does not remove the gate insulating film is used upon removing the mask.

3. The method of manufacturing a semiconductor device according to claim 1, wherein the mask insulating film is made of silicon nitride and the gate insulating film is made of silicon oxide.

4. The method of manufacturing a semiconductor device according to claim 2, wherein the mask insulating film is made of silicon nitride and the gate insulating film is made of silicon oxide.

5. The method of manufacturing a semiconductor device according to claim 1, wherein an etching rate of the semiconductor substrate and an etching rate of the conductive film are substantially equal to each other.

6. The method of manufacturing a semiconductor device according to claim 1, wherein the semiconductor substrate is made of single crystal silicon, and the conductive film is made of polycrystalline silicon.

7. The method of manufacturing a semiconductor device according to claim 5, wherein the semiconductor substrate is made of single crystal silicon, and the conductive film is made of polycrystalline silicon.

8. The method of manufacturing a semiconductor device according to claim 1, further comprising:
etching off a protrusion of the gate insulating film from the surface of the semiconductor substrate after etching back the conductive film.

9. The method of manufacturing a semiconductor device according to claim 2, further comprising:
etching off a protrusion of the gate insulating film from the surface of the semiconductor substrate after etching back the conductive film.

10. The method of manufacturing a semiconductor device according to claim 5, further comprising:
etching off a protrusion of the gate insulating film from the surface of the semiconductor substrate after etching back the conductive film.

11. The method of manufacturing a semiconductor device according to claim 1, wherein the gate insulating film is formed to a thickness of approximately 500 Å.

12. The method of manufacturing a semiconductor device according to claim 1, wherein the mask is removed with a phosphoric acid.

13. The method of manufacturing a semiconductor device according to claim 1, wherein the mask insulating film is formed by chemical vapor deposition.

14. The method of manufacturing a semiconductor device according to claim 1, wherein the mask is formed by photolithography and etching.

15. The method of manufacturing a semiconductor device according to claim 1, wherein the gate insulating film is formed by thermal oxidation.

16. The method of manufacturing a semiconductor device according to claim 1, wherein the conductive film is formed by chemical vapor deposition.

17. The method of manufacturing a semiconductor device according to claim 1, wherein the conductive film is etched back using dry etching.

18. The method of manufacturing a semiconductor device according to claim 1, wherein the removal of the mask exposes the surface of the semiconductor substrate.

* * * * *